United States Patent [19]
Sakamoto

[11] Patent Number: 5,374,923
[45] Date of Patent: Dec. 20, 1994

[54] POWER-ON DETECTING CIRCUIT

[75] Inventor: Wataru Sakamoto, Hyogo, Japan

[73] Assignee: Mitsubishi Denki Kabushiki Kaisha, Tokyo, Japan

[21] Appl. No.: 945,783

[22] Filed: Sep. 16, 1992

[30] Foreign Application Priority Data

Dec. 16, 1991 [JP] Japan .................. 3-331748

[51] Int. Cl.$^5$ ............................................. G08B 21/00
[52] U.S. Cl. .................... 340/654; 327/143; 327/546
[58] Field of Search ............. 307/272.3, 296.1, 296.4, 307/296.5, 491, 594; 340/654

[56] References Cited

U.S. PATENT DOCUMENTS

| | | | |
|---|---|---|---|
| 4,818,904 | 4/1989 | Kobayashi | 307/594 |
| 4,902,907 | 2/1990 | Haga et al. | 307/272.3 |
| 5,151,614 | 9/1992 | Yamazaki et al. | 307/272.3 |
| 5,172,012 | 12/1992 | Ueda | 307/272.3 |
| 5,177,375 | 1/1993 | Ogawa et al. | 307/272.3 |

FOREIGN PATENT DOCUMENTS

| | | |
|---|---|---|
| 303886 | 4/1972 | Austria . |
| 3332940C1 | 7/1984 | Germany . |
| 3518448A1 | 11/1986 | Germany . |
| 2284767 | 11/1990 | Japan . |

*Primary Examiner*—Jeffery A. Hofsass
*Attorney, Agent, or Firm*—Lowe, Price, LeBlanc & Becker

[57] ABSTRACT

A power-on detecting circuit includes a capacitance for sensing power-on, and a signal generating circuit which responds to the output node potential of capacitance by generating a signal indicative of the power-on. The signal generating circuit includes inverter circuits forming a latch circuit. The power-on detecting circuit includes a control circuit, which adjusts driving capabilities of inverter circuits at the power-on and power-off, or an activation control circuit, which delays the activation timing. The control circuit differentiates the driving capability of the latch circuit formed of inverter circuits at the power-on from that at the power-off. Activation control circuit activates signal generating circuit at the time the potential of the output node ND10 of a sensing circuit rises above the potential of the output node of signal generating circuit.

19 Claims, 12 Drawing Sheets

POWER-ON DETECTING CIRCUIT

BACKGROUND OF THE INVENTION

1. Field of the Invention

The present invention relates to a power-on detecting circuit for detecting application of power to an electronic circuit device.

2. Description of the Background Art

In various electronic circuit devices, it is necessary to internally initialize circuit devices upon power-on. For this purpose, there have been used power-on detecting circuits which monitor power supply potentials and generate signals indicating the power-on when the power is applied.

FIG. 11 schematically shows a construction of a general electronic circuit device. In FIG. 11, the electronic circuit device (will be called merely "semiconductor device" hereinafter) 500 includes an internal circuit 510 for carrying out a predetermined function, a power-on detecting circuit 520 which monitors a power supply potential applied to a power application node (or power terminal) 550 and generates a power-on detection signal /POR indicating the power-on when the power is applied, and an initializing circuit 530 which is responsive to power-on detection signal /POR to initialize or reset internal circuit 510.

Internal circuit 510 may be any circuit device such as a semiconductor memory device or logical processing device. Power-on detecting circuit 520 generates power-on detection signal /POR when the power supply potential applied to power application node 550 rises to a predetermined potential. Initializing circuit 530 is activated in response to a state transition (i.e., rise or fall) of power-on detection signal /POR and initializes or resets a predetermined circuit portion in internal circuit 510.

The initialization of internal circuit 510 upon the power-on enables a stable operation of semiconductor device 500 when it carries out the intended processing thereafter.

FIG. 12 shows an example of a construction of the power-on detecting circuit in the prior art. Referring to FIG. 12, power-on detecting circuit 520 includes a capacitance 1 for achieving capacitive coupling between a power line 55 and a node ND1, an inverter circuit 3 for inverting a potential of node ND1, an inverter circuit 2 for inverting and transmitting an output of inverter circuit 3 to node ND1, an inverter circuit 4 for inverting the output of inverter circuit 3, and an inverter circuit 5 for inverting an output of inverter circuit 4 and generating power-on detection signal /POR.

The capacitance 1 monitors a power supply potential VCC transmitted to power line 55, and responds to the rise of power supply potential VCC at the power-on by rising the potential of node ND1.

Inverter circuits 2 and 3 form a latch circuit, which latches the potential of node ND1 and stably generates the signal indicating the power-on.

Inverter circuit 3 includes p-channel MOS (insulated gate type field effect) transistors P1 and P2 which receive the potential of node ND1 at respective gates, and n-channel MOS transistors N1 and N3 which receive the potential of node ND1 at respective gates. Transistors P1, P2, N1 and N3 are complementarily connected between power supply potential VCC and the ground potential. Inverter circuit 3 further includes a p-channel MOS transistor P3 disposed in parallel to p-channel MOS transistor P2 for receiving the output of inverter circuit 4 at its gate, and an n-channel MOS transistor N2 disposed in parallel to n-channel MOS transistor N1 for receiving the output of inverter circuit 4 at its gate.

Power-on detecting circuit 520 further includes a capacitance 7 disposed between an output node ND5 of inverter circuit 3 and the ground potential, a delay circuit 8 which responds to the output of inverter circuit 5 and generates a reset signal after a predetermined time elapses, and a reset circuit 6 which responds to the output of delay circuit 8 by resetting the potential of node ND1 to the ground potential, Capacitance 7 slows the rise of the potential at output node ND5 of inverter circuit 3, whereby the latch capability of the latch circuit formed of inverter circuits 2 and 3 is weakened upon the power-on.

Delay circuit 8 includes a p-channel MOS transistor P4 and an n-channel MOS transistor N8 which receive the output of inverter circuit 5 at their gates, a p-channel MOS transistor P6 which is disposed between one conduction terminal of transistor P4 and a node ND3 and has a gate connected to the ground potential, an n-channel MOS transistor N10 disposed between node ND3 and output node ND4 of delay circuit 8, and an n-channel MOS transistor N12 which is responsive to the output of inverter circuit 5 to electrically connect node ND4 to the ground potential. Transistor P6 is normally in the on-state and functions as a resistor. Transistor N10 has a gate and a drain connected together, and functions as a resistor. Transistor N12 sets node ND4 at the ground potential level when power-on detection signal /POR rises to the high level.

Reset circuit 6 includes an n-channel MOS transistor N6, which receives the output of delay circuit 8 at its gate and electrically connects node ND1 to the ground potential.

Delay circuit 8 transmits the signal at the high level to node ND4 when power-on detection signal /POR is fixed at the low level and supply voltage VCC reaches a predetermined stable value. Owing to the function of delay circuit 8, power-on detection signal /POR attains the high level when supply voltage VCC is stabilized.

Now, an operation of the power-on detecting circuit shown in FIG. 12 will be described below with reference to a waveform diagram of FIG. 13.

When the power is applied to the semiconductor device, supply voltage VCC on power line 55 rises to the high level. In response to the rise of supply voltage VCC, the potential of node ND1 rises to the high level owing to the capacitive coupling of capacitance 1. Transistors P1 and P2 in inverter circuit 3 are turned off and transistors N1 and N3 are turned on, so that the potential of node ND5 attains the low level. The low level of node ND5 is transmitted through inverter circuit 2 to node ND1. Therefore, even if the potential of node ND1 has risen insufficiently, the latch circuit formed of inverter circuits 3 and 2 carries out the latch operation, whereby the potential of node ND1 is stabilized at the high level.

Meanwhile, the potential of node ND5 is transmitted through inverter circuit 4 to the gates of transistors P3 and N2. Thereby, transistor P3 is turned off and transistor N2 is turned on, so that node ND5 is discharged more strongly to the ground potential.

The potential of node ND2 is transmitted through inverter circuit 5 to delay circuit 8. The output of inverter circuit 5 is currently at the low level. In the delay circuit 8, transistor P4 is turned on, and transistor N8 is turned off. Thereby, node ND3 is charged through transistors P4 and P6. In this operation, transistor P6 functions as the resistor, and thus the potential of node ND3 slowly rises. When the potential of node ND3 becomes higher than a threshold voltage Vth of transistor N10, transistor N10 is turned on, and thus the potential of node ND3 is transmitted to node ND4. Transistor N12 is in the off-state.

When the potential of node ND4 exceeds the threshold voltage of transistor N6 in reset circuit 6, transistor N6 is turned on. Thereby, the high level of node ND1 is discharged to the ground potential level, i.e., low level. The driving capability of transistor N6 is larger than the driving capability of inverter circuit 2. When the potential of node ND1 falls to the low level through the on-state transistor N6, transistors P1 and P2 in inverter circuit 3 are turned on and transistors N1 and N3 are turned off. Thereby, node ND5 is slowly charged by the capacitance 7, and the potential thereof rises to the high level.

When the potential level of node ND5 becomes higher than the input logical threshold voltage of inverter circuit 4, the potential of node ND2 falls to the low level, and correspondingly, power-on detection signal /POR sent from inverter circuit 5 rises to the high level.

In response to the rise of power-on detection signal /POR to the high level, transistors N8 and N12 are turned on and transistor P6 is turned off in delay circuit 8. Thereby, nodes ND3 and ND4 are discharged to the ground potential, i.e., low level, and transistor N6 in reset circuit 6 is turned off.

When the potential level of node ND1 is the low level and the potential of node ND5 exceeds the logical threshold voltage of inverter circuit 2, the latch circuit formed of inverter circuits 2 and 3 functions, to fix the potential of node ND1 at the low level.

In response to the fall of the potential of node ND2, transistor P3 is turned on and transistor N2 is turned off, whereby node ND5 is rapidly charged by transistors P1, P2 and P3.

In the stable state after the power-on, the potential level of node ND1 is the low level, and power-on detection signal /POR is at the high level.

Provision of the capacitance 7 described above slows the rising speed of the potential of node ND5, which achieves the stable latch state of the latch circuit formed of inverter circuits 2 and 3.

Delay circuit 8 activates reset circuit 6 after the elapsing of the predetermined time, utilizing the resistance action of transistors P6 and N10. Thereby, after supply voltage VCC attains the stable state, power-on detection signal /POR rises to the high level, so that erroneous generation of the power-on detection signal, which may be caused in the instable transition state at the power-on, is prevented.

When reset node ND1 is reset at the low level, node ND5 is rapidly charged by the transistors P3 and N2, which quickens the latch operation.

When the power is turned off, the supply voltage VCC of power line 55 falls from the high level to the low level. Node ND1 is already at the low level, and transistor N6 in reset circuit 6 is in the off-state. Therefore, the potential of node ND1 slightly lowers down to a negative potential due to the capacitive coupling by capacitance 1. Transistors P1 and P2 are in the on-state, and transistors N1 and N3 are in the off-state. Therefore, the potential of node ND5 is discharged through transistors P2 and P1 to power supply potential VCC (which lowers to the potential of 0V), and thus the potential of the node ND5 lowers. Also, in response to the fall of supply voltage VCC to the low level, the output of inverter circuit 5 also attains the low level, so that power-on detection signal /POR falls to the low level.

As described above, the conventional power-on detecting circuit uses capacitance 1 for detecting or sensing the power-on. Therefore, when supply voltage VCC falls to the low level (ground potential level) at the power-off, the potential of node ND1 further lowers, as indicated by a dashed line in FIG. 13, from the ground potential level, i.e., low level to the negative potential due to the capacitive coupling! of capacitance 1. Thus, the negative charges remain in node ND1.

Although capacitance 7 is employed for surely inverting the latch state of the latch circuit formed of inverter circuits 2 and 3, positive charges are accumulated in node ND5 of capacitance 7 in the stable state. At the power-off, the positive charges of node ND5 are discharged through transistors P1, P2 and P3 to power line 55. Transistor P3 is turned off when the potential of node ND5 lowers, and the positive charges of node ND5 are ultimately discharged through transistors P2 and P1 to power line 55. The driving power of transistor P2 is not so large and transistors P1 and P2 have the resistance components, so that node ND5 is not sufficiently discharged. Thus, the positive charges remain at node ND5 as shown in FIG. 13(f), and the potential thereof becomes positive.

When the power is applied subsequently to the state in which node ND1 has accumulated the negative charges and node ND5 has accumulated the positive charges, power-on detection signal /POR may not be generated correctly. An operation at the power-on subsequent to the power-off will be described below with reference to FIG. 14.

Upon application of supply voltage VCC, the potential of node ND1 first rises to the high level. After the elapsing of the predetermined time, the reset signal from delay circuit 8 causes the potential of node ND1 to fall to the low level (ground potential level), and correspondingly, the potential of node ND5 rises. In accordance with the rise of the potential of node ND5, power-on detection signal /POR rises from the low level to the high level.

When supply voltage VCC falls to the low level in accordance with the power-off, the potential of node ND1 maintains the negative potential, and the potential of node ND5 maintains the positive potential. In accordance with the lowering of supply voltage VCC to the low level, inverter circuit 5 does not operate any longer, and thus power-on detection signal /POR is slowly discharged.

When supply voltage VCC is raised to the high level subsequently to this state, the potential of node ND1 does not rise to the high level, but rises from the negative potential only to the positive low level. The potential of node ND1 is maintained at the ground potential level by reset circuit 6 after the predetermined time elapses.

When the potential of node ND5 is at high level due to the residual positive charges, the output of inverter circuit 4 attains the low level, and node ND5 is charged to the high level by transistors P1, P2 and P3 in response to the rise of supply voltage VCC to the high level. In response to this charging, power-on detection signal /POR is maintained at the high level immediately after the application of supply voltage VCC, and does not change to the high level after being once fixed at the low level.

Usually, the initializing circuit responds to the transition of power-on detection signal /POR from the low level to the high level by detecting the power-on and carrying out the initializing operation. Therefore, the initializing operation or reset operation in accordance with the power-on cannot be carried out in the initializing circuit, and thus the semiconductor device cannot be set in the stable initial state when the power is applied.

Even if the initializing circuit were constructed to operate in accordance with the high level of power-on detection signal /POR, the reliable initialization or reset operation would not be carried out, because power-on detection signal /POR causes the initializing operation or reset operation under the instable power supply voltage state immediately after the power-on.

If the negative charges remain in node ND1, the potential of node ND1 starts to rise at the power-on due to the capacitive coupling of capacitance 1. However, the potential of node ND1 rises-slowly, because the it rises from the negative potential. Therefore, the current flows through transistors P1 and P2 into node ND5 in response to the power-on, before the potential of node ND1 attains the high level, and thus the potential of node ND5 rises. Node ND5 has accumulated the positive charges. Therefore, the potential of node ND5 attains the high level more rapidly, and the potential of node ND1 is fixed at the low level by inverter circuit 2, so that the effect of the capacitive coupling of capacitance 1 is not fully utilized.

SUMMARY OF THE INVENTION

It is an object of the invention to provide a power-on detecting circuit which can generate a power-on detection signal indicating the application of power.

Another object of the invention is to provide a power-on detecting circuit which can surely exclude an influence by residual charges caused at the power-off.

A power-on detecting circuit according to a first aspect of the invention includes sensing circuitry for sensing power-on and power-off, and signal generating circuitry for generating a signal indicative of the power-on in response to an output of the sensing circuitry. The signal generating circuitry includes a latch circuit having an input coupled to an output of the sensing circuitry and an output coupled back to the input.

The power-on detecting circuit according to the first aspect of the invention further includes circuitry for adjusting a driving capability of the latch circuit in response to the power-on and power-off.

A power-on detecting circuit according to a second aspect of the invention includes sensing circuitry for sensing power-on and power-off, signal generating circuitry for generating a power-on detection signal in response to an output of the sensing circuitry, and delay circuitry for delaying an activation timing of the signal generating circuitry in response to the power-on.

In the power-on detecting circuit according to the first aspect of the invention, the adjusting circuitry adjusts the driving capability of the latch circuit included in the signal generating circuitry. Thereby, an amount of residual charges at the power-off can be adjusted, and influence by the residual charges can be eliminated.

In the power-on detecting circuit according to the second aspect of the invention, the activation timing of the signal generating circuitry is delayed relative to the power-on timing. Thereby, under the condition of the stable output of the sensing circuitry the signal generating circuitry is activated so that the power-on detection signal can be stably generated.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
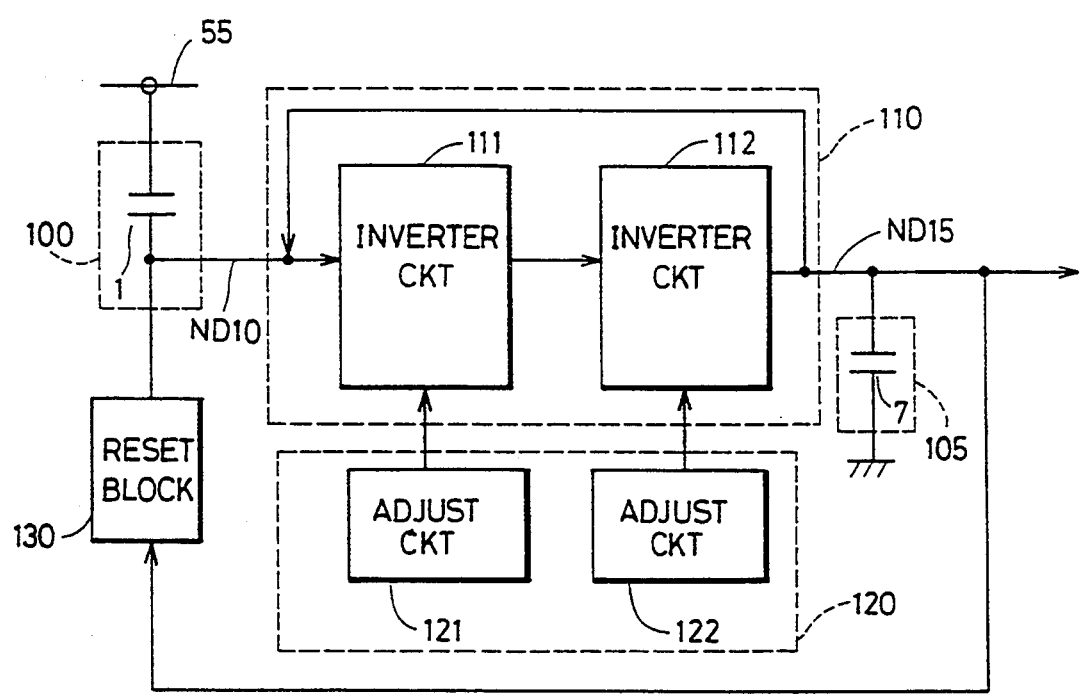
FIG. 1 shows a functional construction of a power-on detecting circuit of an embodiment of the invention.

FIG. 1 shows a functional construction of a power-on detecting circuit according to an embodiment of the invention. Referring to FIG. 1, a power-on detecting circuit includes a sensing circuit 100 which is coupled to a power line 55 and monitors a potential of power line 55 for sensing power-on and power-off, a signal generating circuit 110 which is responsive to an output of sensing circuit 100 to generate a signal indicating the power-on, and an adjusting circuit 120 for adjusting a driving power of signal generating circuit 110.

Sensing circuit 100 includes a capacitance 1 coupled to power line 55. Signal generating circuit 110 includes an inverter circuit 111 for receiving an output of sensing circuit 100, and an inverter circuit 112 for receiving an output of the inverter circuit 111. An output of inverter circuit 112 is fed back to an input of inverter circuit 111. Signal generating circuit 110 is comprised of a latch circuit which is formed Of two cascaded inverter circuits 111 and 112.

Control circuit 120 includes an adjusting circuit 121 for adjusting a driving power of inverter circuit 111 at the power-on and power-off, and an adjusting circuit 122 for adjusting a driving power of inverter circuit 112 at the power-on and power-off.

The power-on detecting circuit further includes an output state adjusting circuit 105 for facilitating transition of a latch state of signal generating circuit 110, and a reset block 130 for resetting the output of sensing circuit 100 in response to the output of signal generating circuit 110. The adjusting circuit 121 adjusts the driving power of inverter circuit 111 at the power-on so as to allow rapid accumulation of the positive charges in node ND10, and also adjusts the driving power of inverter circuit 111 so as to prevent the accumulation of the negative charges in node ND10 at the power-off.

Adjusting circuit 122 adjusts the driving power of inverter circuit 112 so as to increase the speed of the charging of node ND15 at the power-on and to prevent the accumulation of the negative charges in node ND15 at the power-off.

Figure 2:
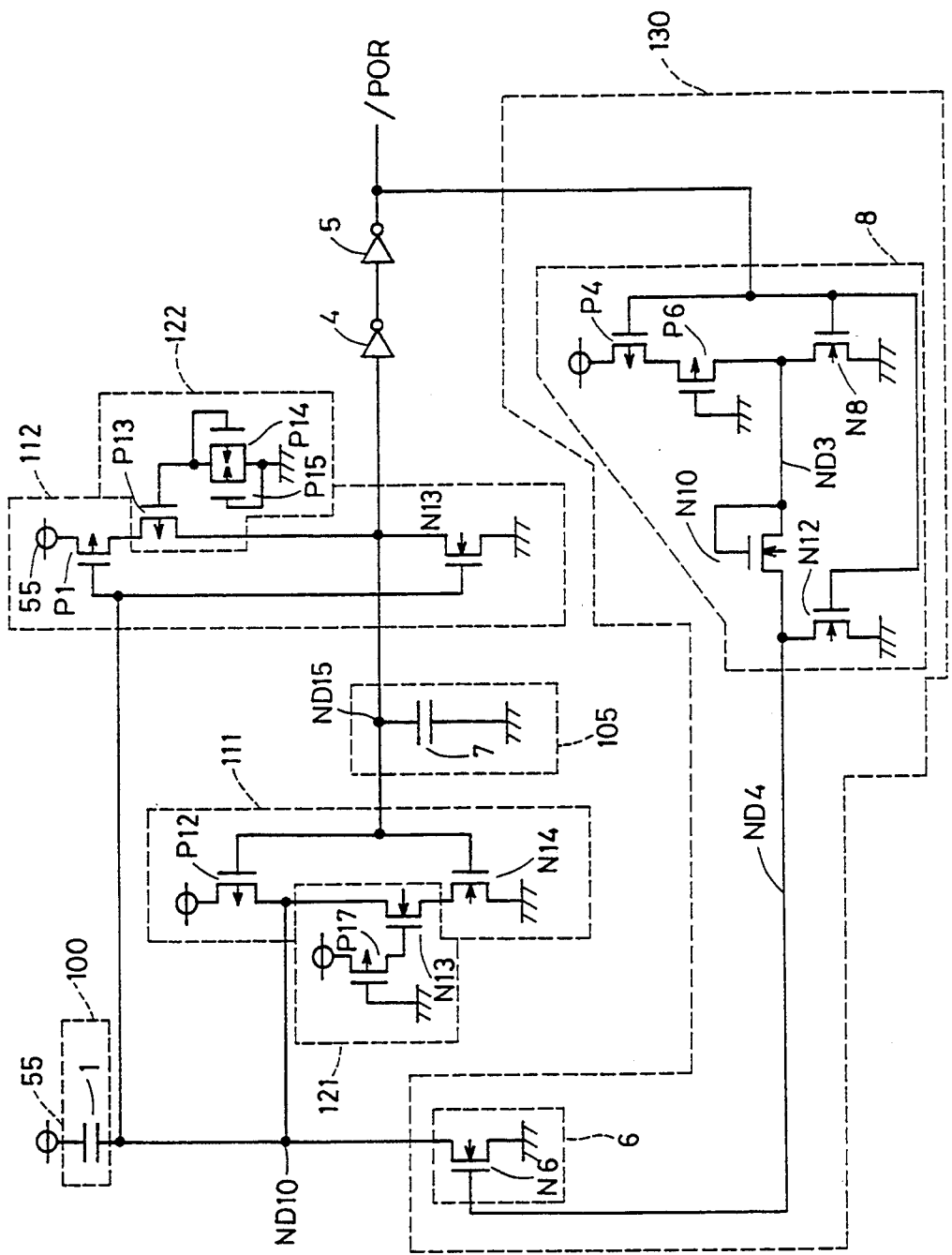
FIG. 2 shows a specific construction of a power-on detecting circuit shown in FIG. 1.

FIG. 2 shows an example of a specific construction of the power-on detecting circuit shown in FIG. 1. In FIG. 2, portions having the same functions as those in the conventional power-on detecting circuit shown in FIG. 12 bear the same reference numerals.

Figure 10:
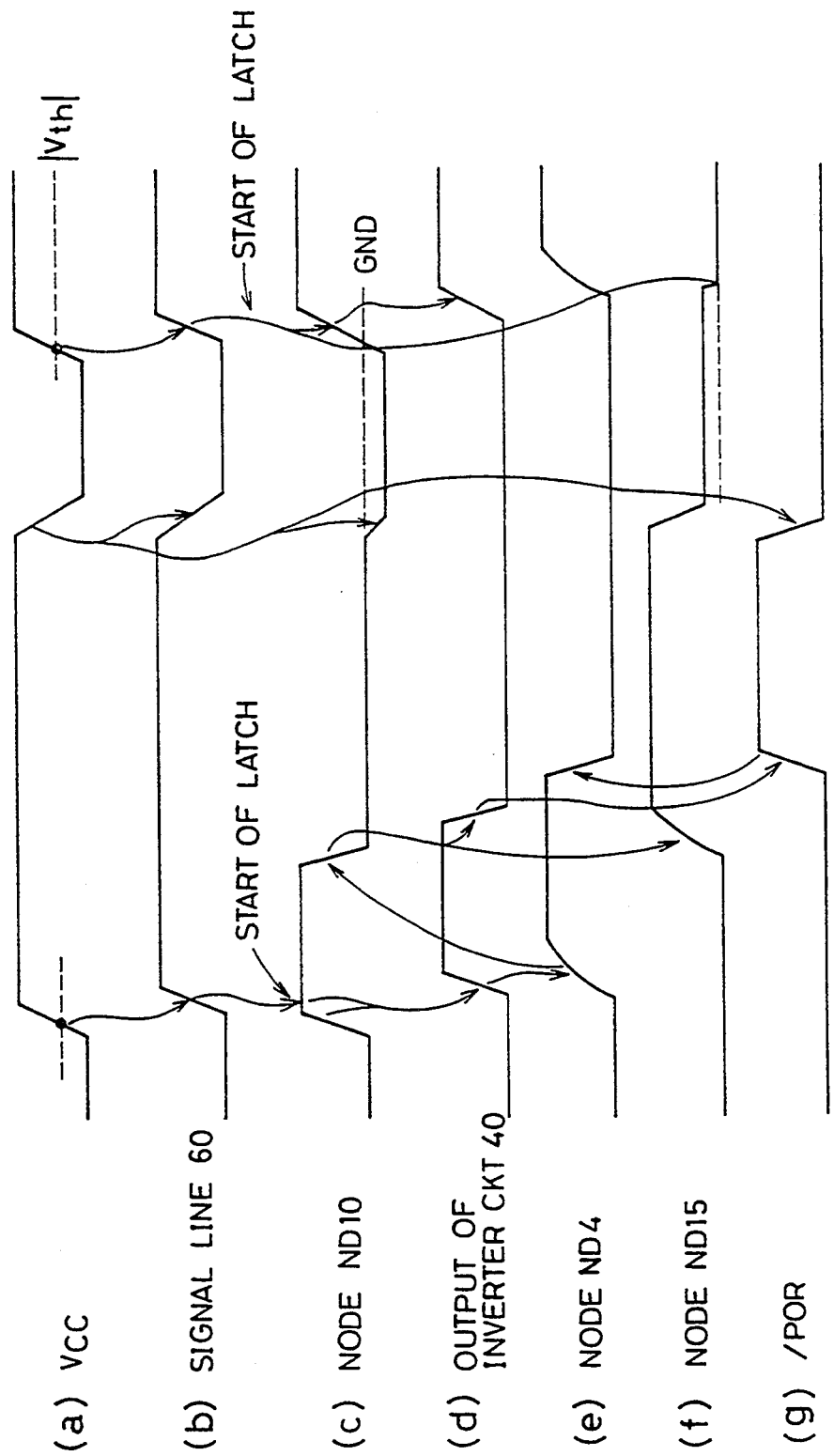
FIG. 10 is a signal waveform diagram showing an operation of a power-on detecting circuit shown in FIGS. 8 and 9.
Figure 11:
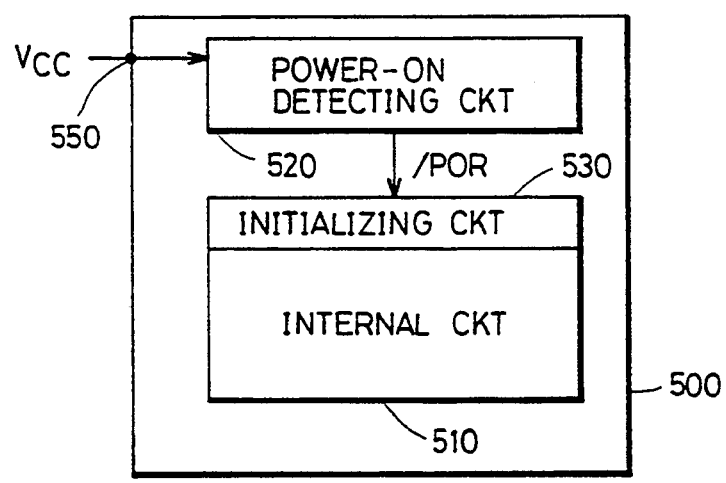
FIG. 11 schematically shows a construction of a general semiconductor device.

In FIG. 2, sensing circuit 100 includes capacitance 1 for providing the capacitive coupling of power line 55 to node ND10. Capacitance 1 included in sensing circuit 100 has the same function as capacitance 1 in the conventional power-on detecting circuit shown in FIG. 10.

Inverter circuit 111 included in the signal generating circuit 110 includes a p-channel MOS transistor P12, which has one conduction terminal connected to power supply potential VCC, the other conduction terminal coupled to node ND10 and a gate connected to node ND15, and also includes an n-channel MOS transistor N14, which has one conduction terminal-connected to the ground potential and a gate connected to node ND15. An adjusting circuit 121 having a variable resistance disposed between node ND10 and the other conduction terminal of transistor N14.

Adjusting circuit 121 includes a p-channel MOS transistor P17, which has one conduction terminal coupled to power supply potential VCC and a gate connected to the ground potential, and also includes an n-channel MOS transistor N13, which has a gate coupled to the other conduction terminal of transistor P17, one conduction terminal connected to node ND10, and the other conduction terminal connected to the other conduction terminal of transistor N14.

Inverter circuit 112 includes a p-channel MOS transistor P1, which has one conduction terminal connected to power supply potential VCC and a gate connected to node ND10, and also includes an n-channel MOS transistor N3, which has a gate connected to node ND10, one conduction terminal connected to the ground potential, and the other conduction terminal connected to node ND15. Adjusting circuit 122 is interposed between transistor P1 and transistor N3.

Adjusting circuit 122 includes a p-channel MOS transistor P13, which has one conduction terminal connected to the other conduction terminal of transistor P1 and the other conduction terminal connected to node ND15, and also includes resistance means connected between transistor P13 and the ground potential. The resistance means includes a p-channel MOS transistor P15 which is diode-connected in a forward direction between the gate of transistor P13 and the ground potential, and a p-channel MOS transistor P14 which is diode-connected in a backward direction therebetween.

Node ND15 is connected to cascaded inverter circuits 4 and 5. Inverter circuits 4 and 5 form a drive circuit. Inverter circuit 5 generates power-on detection signal /POR.

A reset block 130 shown in FIG. 1 includes reset circuit 6 including n-channel MOS transistor N6 for resetting, and delay circuit 8. Structures and operations of reset circuit 6 and delay circuit 8 are similar to those of reset circuit 6 and delay circuit 8 shown in FIG. 10, and corresponding portions bear the same reference numerals.

Transistors P17, P14 and P15 included in adjusting circuits 121 and 122 have resistances which are determined approximately ten times as large as those of the other transistors. Transistors N13 and P13 have relatively large resistances which are approximately five or six times as large as those of the other ordinary MOS transistors such as PMOS transistors P12 and P1 for charging, and have large gate areas for enhancing the current supply capabilities.

Transistors N3 and N14 also have large gate areas which are approximately five or six times as large as those of transistors P1 and P2 so as to enhance the driving capabilities.

These resistances and gate areas of the transistors can be achieved by adjusting the gate lengths and gate widths.

Figure 3:
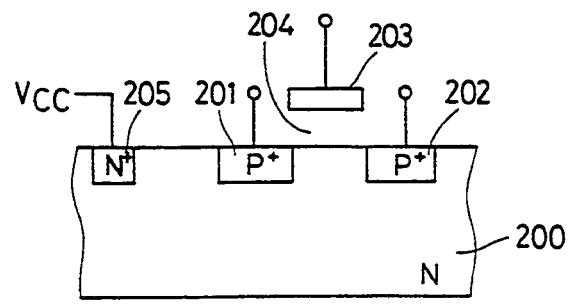
FIG. 3 schematically shows a sectional construction of a P-channel MOS transistor.

FIG. 3 shows a sectional construction of the p-channel MOS transistor shown in FIG. 2. In FIG. 3, the p-channel MOS transistor includes P+ impurity regions 201 and 202 having a high impurity concentration and formed on an N-type substrate (which may be a well region, and is a region achieving a function of the substrate) 200, and a gate electrode 203 formed on N-type substrate region 200 with a gate insulating film 204 therebetween. Supply voltage VCC is applied to N-type substrate region 200 of the p-channel MOS transistor through an N+ impurity region 205 having a high impurity concentration. Thus, the supply voltage VCC is applied as the back gate bias of the p-channel MOS transistor.

Figure 4:
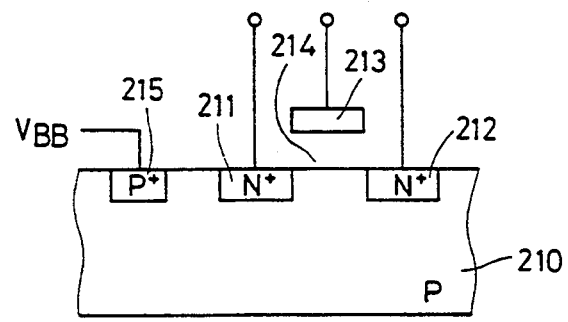
FIG. 4 schematically shows a sectional construction of an N-channel MOS transistor.

FIG. 4 shows a sectional construction of the n-channel MOS transistor. In FIG. 4, the n-channel MOS transistor includes N+ impurity regions 211 and 212 having a high impurity concentration and formed on a surface of a P-type substrate region 210, and a gate electrode 213 formed on P-type substrate region 210 with a gate insulating film 214 therebetween. A predetermined substrate bias voltage VBB is applied to P-type substrate region 210 of n-channel MOS transistor through P+ impurity region 215 having a high impurity concentration. Substrate bias voltage VBB is generally a negative voltage of about −3V (if supply voltage VCC is 5V) or a voltage at the ground potential level. In a case of a semiconductor memory device or the like, the applied substrate bias voltage is at the negative potential. In a case of a semiconductor memory device having a triple diffusion well construction, a logical circuit of an ASIC (Application Specific IC), or a semiconductor memory device formed on the same substrate as logic circuitry, the applied substrate bias voltage is at the ground potential level. Now, an operation of the power-on detecting circuit will be described below.

Figure 5:
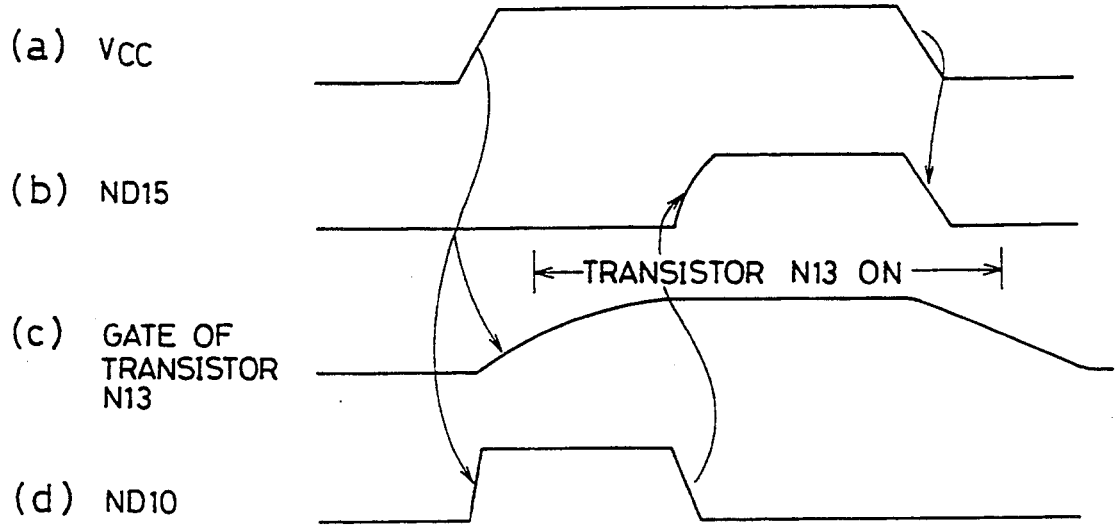
FIG. 5 is a signal waveform diagram showing an operation of an inverter circuit for driving an input node of a signal generating circuit shown in FIGS. 1 and 2, and an operation of an adjusting circuit for adjusting a driving capability of this inverter circuit.

Referring to FIG. 2 and FIG. 5, operations of inverter circuit 111 and adjusting circuit 121 will now be described.

Upon application of the power, the potential of node ND10 rises due to the capacitive coupling of capacitance 1 included in sensing circuit 100. Transistor P17 receives at its gate the ground potential, and thus is in the onstate. The on-resistance of transistor P17 is determined approximately ten times as large as that of transistor P12. Therefore, the gate potential of transistor N13 slowly rises. In an initial state after the power-on, the gate potential of transistor N13 is low and thus is in a high resistance state. Therefore, there is no path through which the current flows from node ND10 to the ground potential (i.e., the positive charges are drains), and thus the potential of node ND10 rapidly rises due to the supply of the positive charges by the capacitive coupling of capacitance 1 (sensing circuit 100) and owing to the charging through transistor P12.

After a predetermined time elapses, reset circuit 6 included in reset block 130 is activated in response to the output of delay circuit 8, and falls the potential of node ND10 to the ground potential level. Responsively, the potential of node ND15 is raised by the charging through inverter circuit 112. The rising speed of the potential of node ND15 depends on the charging speed of capacitance 7. In this operation, the gate of transistor N13 has been charged to the high level. When the potential of node ND15 exceeds the input logical threshold voltage of inverter circuit-4, power-on detection signal /POR rapidly rises to the high level owing to the function of inverter circuits 4 and 5 forming the drive circuit. Transistor N14 is turned on and transistor P12 is turned off, so that the potentials of nodes ND10 and ND15 are latched.

When the power is turned off and supply voltage VCC falls, the positive charges are drawn from node ND10 owing to the capacitive coupling of capacitance 1 (sensing circuit 100). Transistor P17 has the high resistance, and the discharging speed of the gate of transistor N13 is slow. Therefore, the gate potential of transistor N13 is at the high level and transistor N13 is in the low resistance state when the power is turned off. The potential of node ND15 is also at the high level owing to capacitance 7. Thereby, node ND10 is connected to the ground potential through transistors N12 and N13 of low resistances. Consequently, even if the potential of node ND10 tends to lower to a negative potential at the power-off, this lowering to the negative potential is prevented because the positive charges are supplied from the ground potential through transistors N13 and N12. Thus, node ND10 does not accumulate the excessive negative charges, and node ND10 substantially has the ground potential.

Thus, adjusting circuit 121 adjusts the resistance of the discharging path of inverter circuit 111 (i.e., current supply capability or driving power of inverter circuit 111) in accordance with the power-on and power-off so as to reduce the discharging speed of the output node (node ND10) of inverter circuit 111 at the power-on and to increase the discharging speed of the output node (node ND10) at the power-off.

Figure 6:
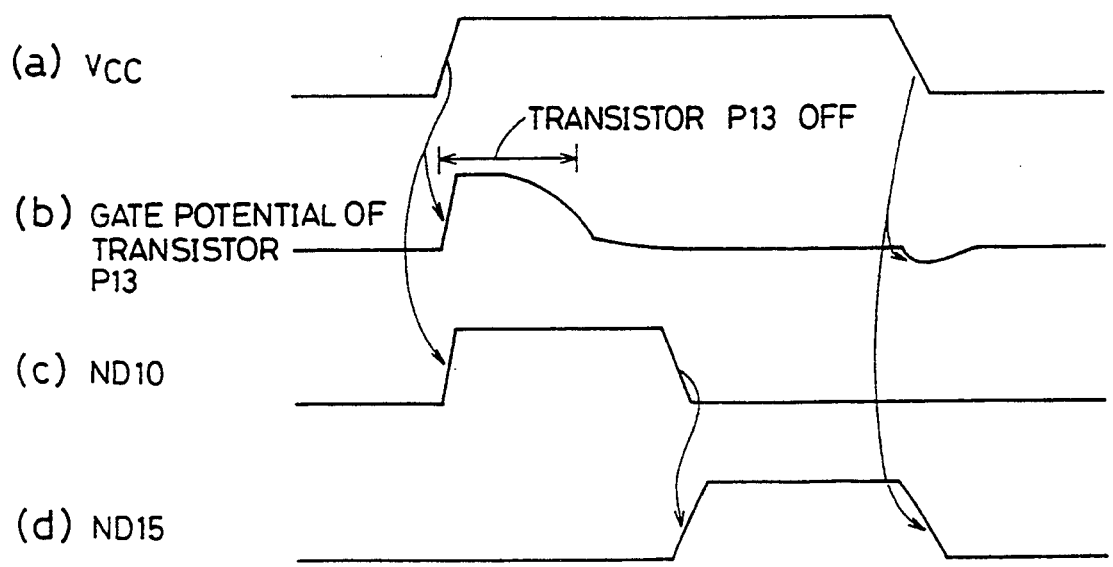
FIG. 6 is a signal waveform diagram showing an operation of an inverter circuit for driving an output node of a signal generating circuit shown in FIGS. 1 and 2, and an operation of an adjusting circuit.

Now, operations of inverter circuit 112 and adjusting circuit 122 will be described below with reference to FIGS. 2 and 6.

Upon application of the power, the potential of node ND10 rises. Transistor P13, of which sectional construction is shown in FIG. 3, receives supply voltage VCC as a back gate bias at its substrate region 200. Since gate insulating film 204 is disposed between gate electrode 203 (see FIG. 3) and substrate region 200, a capacitance is formed therebetween. Therefore, upon application of the power, the potential of the gate of transistor P13 rises to the high level due to the capacitive coupling of gate electrode 203 and substrate region 200. Transistors P14 and P15 have high resistances. The potential of the gate of transistor P13 is discharged to the ground potential through transistor P15 having the high resistances. Therefore, transistor P13 is initially in the off-state after the power-on. Consequently, the current supply passage to node ND15 is surely cut off even if transistor P1 is turned on with the gate potential which is lower than the power supply potential by its threshold voltage immediately after the power-on, because transistor P13 is in the off-state. In response to the rise of the potential of node ND10, transistor N3 is turned on and node ND15 is discharged to the ground potential through transistor N3.

When the potential of the gate of transistor P13 is discharged to the ground potential level through transistor P15, transistor P13 is turned on to be in the low resistance state. After the transistor P13 enters the low resistance state, reset block 130 resets the potential of node ND10 at the ground potential level. Thereby, transistor P1 is turned on and transistor N3 is turned off, so that node ND15 is charged to the power supply potential VCC level through transistor P1 and transistor P13 which has the low resistance. Although the potential of node ND15 slowly rises, power-on detection signal /POR rises to the high level when the potential of node ND15 exceeds the input logical threshold voltage of inverter circuit 4.

When the power is made off, the gate potential of transistor P13 is at the ground potential level by the transistors P14 and P15. The potential of the gate of transistor P13 further lowers through the capacitive coupling between the gate electrode and the substrate, because the power supply voltage lowers upon the power-off. The resistance of transistor P13 is further reduced. When the potential of node ND10 falls due to the power-off, transistor N3 is turned off and transistor P1 is turned on. Thereby, the positive charges accumulated in capacitance 7 are drawn through transistors P13 and P1 to power line 55 (power line 55 has a low impedance, and is rapidly discharged to the ground potential level at the time of the power-off). Consequently, there is no residual positive charge accumulated in the capacitance 7, and the potential of node ND15 goes to the ground potential level.

The negative potential of the gate of transistor P13 is charged to the ground potential level by transistor P14. Therefore, at the subsequent power-on, the potential of the gate of transistor P13 rapidly attains the high level in accordance with the rise of the back gate bias voltage, and transistor P13 goes to the high resistance state.

As described above, adjusting circuit 122 adjusts the driving capability of inverter circuit 112, so that the current supply capability of the output node (node ND15) of inverter circuit 112 may be small at the power-on and the current supply capability of inverter circuit 112 may be large at the power-off.

In the above construction, control circuit 120 includes two adjusting circuits 121 and 122. However, only one of adjusting circuits 121 and 122 may be used. The selection of them depends on the value of substrate bias voltage VBB. If the substrate bias voltage VBB has a small absolute value of, e.g., 0V, only adjusting circuit 122 may be used. Substrate bias voltage VBB is, for example, −3V (in a case of supply voltage VCC of 5V) and thus has a large absolute value, only adjusting circuit 121 may be used. The dependency of the construction of control circuit 120 on VBB has been confirmed by circuit simulation.

Figure 7:
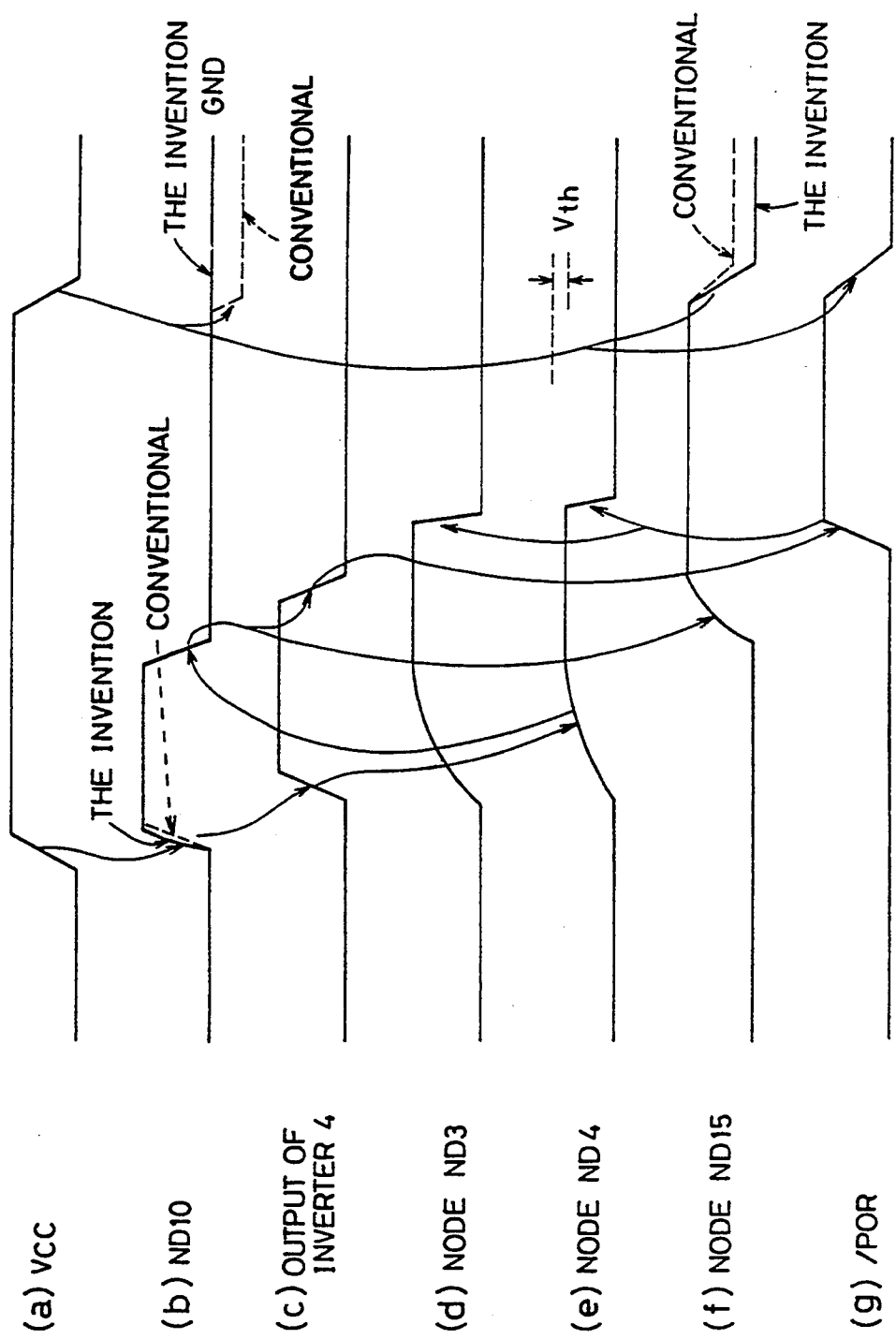
FIG. 7 is a signal waveform diagram showing an overall operation of a power-on detecting circuit shown in FIGS. 1 and 2.

FIG. 7 is a signal waveform diagram showing an entire operation of the power-on detecting circuit according to an embodiment of the invention. Control circuit 120 adjusts the driving capability of signal generating circuit 110 in response to the power-on and power-off. At the power-on, control circuit 120 functions to cut off the path through which the positive charges of node ND10 are drawn, and the potential of node ND10 surely and rapidly rises to a sufficient level owing to the capacitive coupling of capacitance 1.

Figure 12:
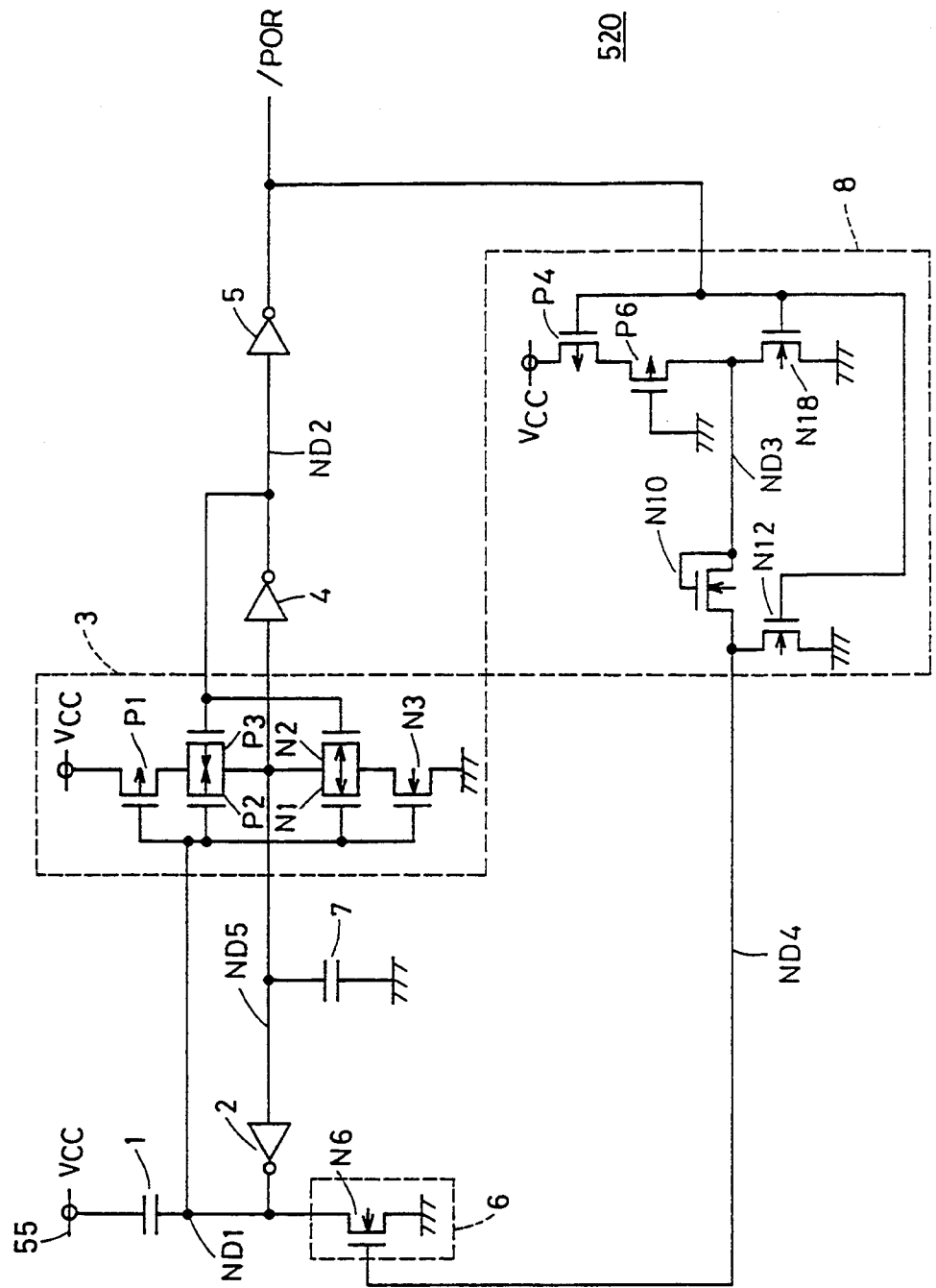
FIG. 12 shows a construction of a conventional power-on detecting circuit.
Figure 13:
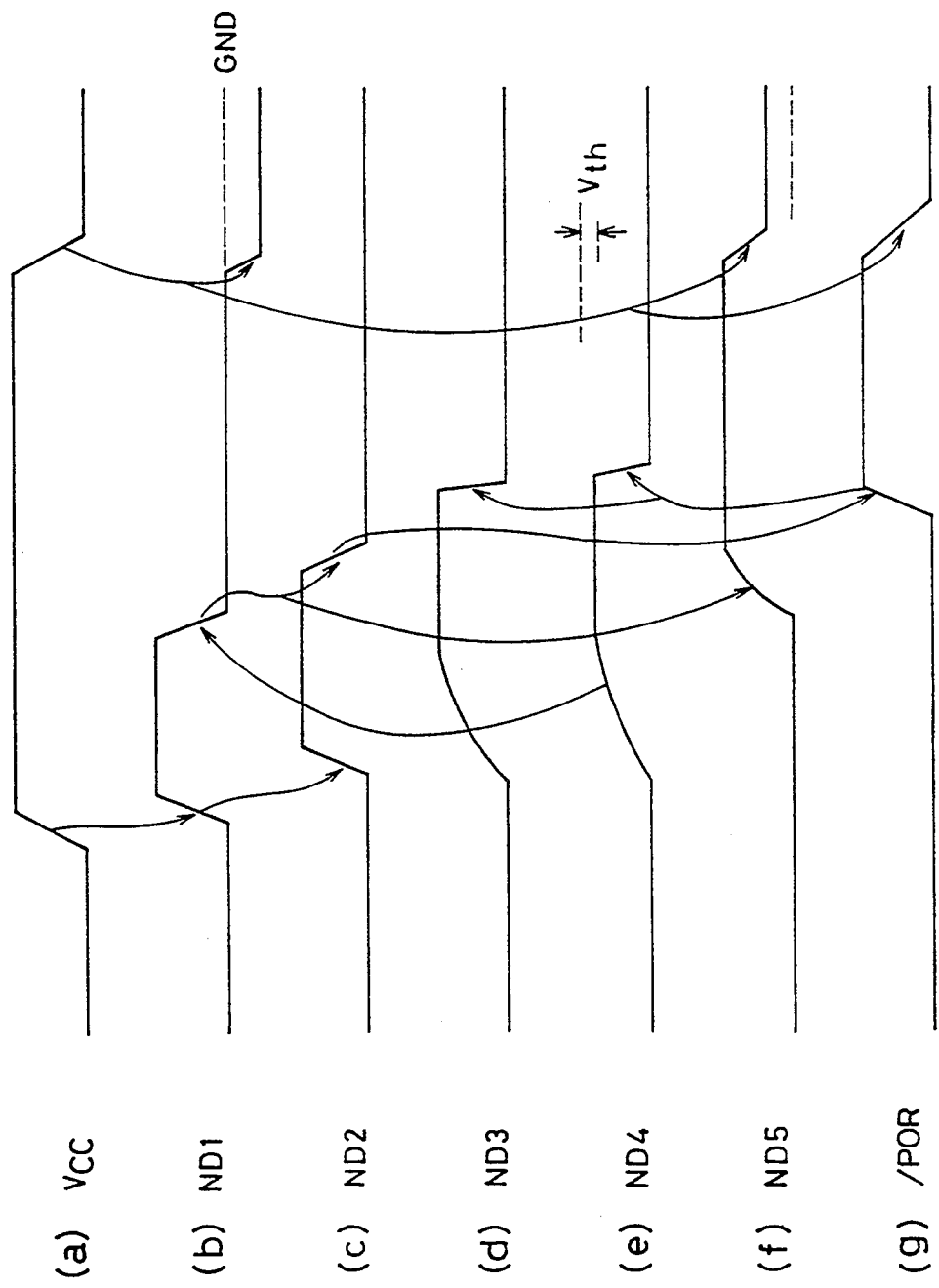
FIG. 13 is a signal waveform diagram showing an operation of the power-on detecting circuit shown in FIG. 12.
Figure 14:
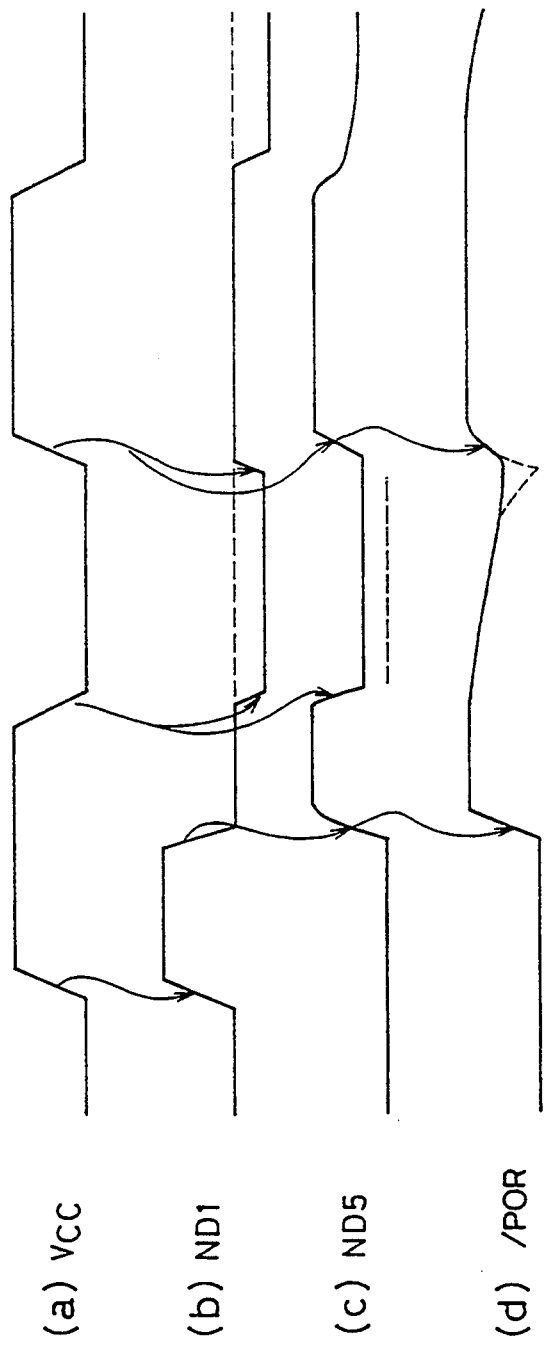
FIG. 14 is a signal waveform diagram for showing a problem of a conventional power-on detecting circuit.

At the power-off, adjusting circuit 121 of control circuit 120 acts to draw the negative charges of node ND10 to the ground potential, and meanwhile, adjusting circuit 122 functions to draw the positive charges of node ND15 to power line 55. Thereby, unnecessary residual charges do not exist in nodes ND10 and ND15, and the respective potentials attain the ground potential, as shown in FIG. 7. In FIG. 7, the changes of the potentials of nodes ND10 and ND15 in the conventional power-on detecting circuit shown in FIG. 12 are indicated by dashed lines for comparison.

By ensuring the discharge of the potentials of nodes ND10 and ND15 to the ground potential in response to the power-off, the power-on detection signal /POR surely rises from the low level to the high level even if the power is applied subsequently to the power-on, and thus the power-on can be surely detected.

Instead of transistors P14, P15 and P17 included in adjusting circuits 121 and 122, resistors having high resistances such as polysilicon or diffused resistors may be used.

Figure 8:
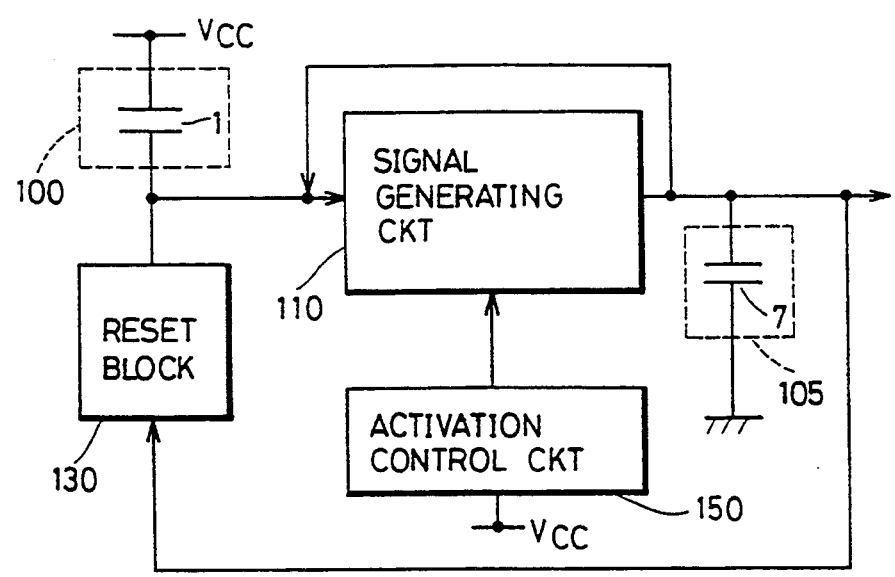
FIG. 8 shows a functional construction of a power-on detecting circuit of another embodiment of the invention.

FIG. 8 shows a functional construction of a power-on detecting circuit according to another embodiment of the invention. In FIG. 8, the Dower-on detecting circuit includes sensing circuit 100 for sensing the power-on, signal generating circuit 110 which generates a signal indicative of the power-on in response to the sense output of sensing circuit 100, and an activation control circuit 150 for adjusting an activation timing of signal generating circuit 110.

Activation control circuit 150 monitors the supply voltage, and activates signal generating circuit 110 with a timing delayed relative to the power-on timing, based on the result of the monitoring.

The power-on detecting circuit further includes output state adjusting circuit 105 provided at an output of signal generating circuit 1120, and reset block 130 which resets the sense output of sensing circuit 100 in accordance with the output of signal generating circuit 110. Output state adjusting circuit 105 and reset block 130 are the same as those shown in FIG. 1.

As shown in FIG. 8, activation control circuit 150 delays the activation timing of signal generating circuit 110 with respect to the power-on, which enables the rise of the potential of the output node in sensing circuit 100 through the capacitive coupling of capacitance 1 included in sensing circuit 100 without a loss of the supplied charges. Thereby, the effect by the capacitive coupling of capacitance 1 in sensing circuit 100 is sufficiently exerted, and thus the detection of the power-on is surely carried out.

Figure 9:
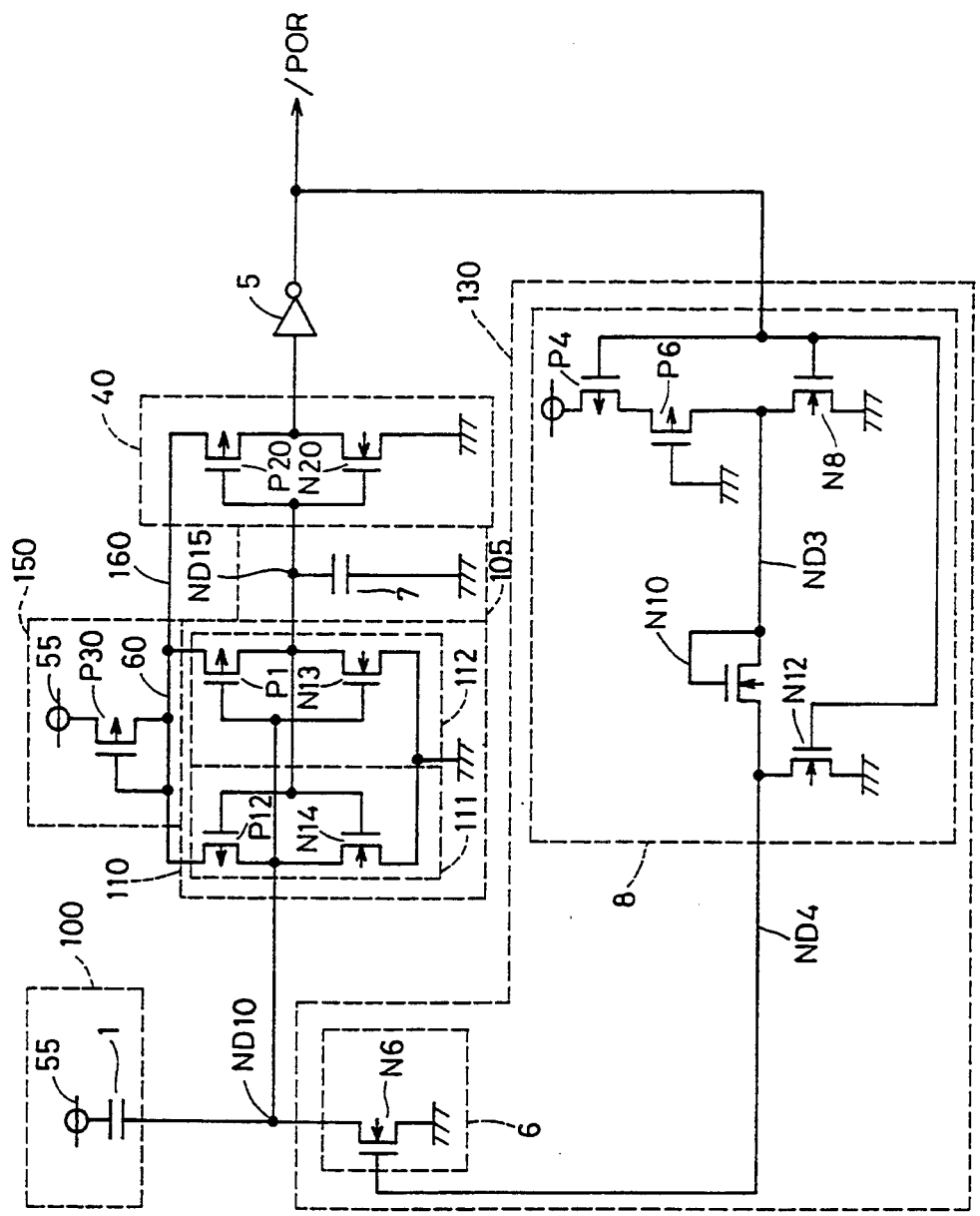
FIG. 9 shows a specific construction of a power-on detecting circuit shown in FIG. 8.

FIG. 9 shows a specific construction of the power-on detecting circuit shown in FIG. 8. Referring to FIG. 9, signal generating circuit 110 includes inverter circuit 112 responsive to the potential of node ND10 for driving node ND15, and inverter circuit 111 responsive to the output of inverter circuit 112, i.e., the potential of node ND15 for driving node ND10. Inverter circuit 111 includes p-channel MOS transistor P12 and n-channel MOS transistor N14 which are complementarily connected between a signal line 160 and the ground line. Inverter circuit 112 includes p-channel MOS transistor P1 and n-channel MOS transistor N3 which are complementarily connected between signal line 160 and the ground potential. Capacitance 7, which provides output state adjusting circuit 105, is disposed between node ND15 and the ground potential.

There is provided a drive circuit 40 in order to rapidly generate power-on detection signal /POR in response to the output of signal generating circuit 110. Drive circuit 40 includes a p-channel MOS transistor P20 and an n-channel MOS transistor N20 which are complementarily connected between signal line 160 and the ground potential.

Activation control circuit 150 includes a p-channel MOS transistor P30 disposed between power line 55 and signal line 160. p-channel MOS transistor P30 has a gate and one conduction terminal (drain) which are connected to signal line 160, and functions as potential lowering means.

Reset block 130 includes delay circuit 8 and reset circuit 6. Reset circuit 6 and delay circuit 8 have the constructions similar to those of the conventional power-on detecting circuit, and thus corresponding portions, which will not be specifically described hereinafter, bear the same reference numerals.

Power-on detection signal /POR is generated from inverter circuit 5 which receives the output of drive circuit 40. Now, an operation of the power-on detecting circuit shown in FIG. 9 will be described below with reference to an operation waveform diagram of FIG. 10.

Upon application of the power, the potential of power line 55 rapidly rises. In response to the rise of the potential of power line 55, the potential of node ND10 rises through to capacitive coupling of capacitance 1. Transistor P30 in activation Control circuit 150 maintains the off-state until the potential of power line 55 becomes equal to or larger than an absolute value of threshold voltage Vthp. Therefore, the potential of signal line 160 is still at the ground potential level. Thereby, signal generating circuit 110 maintains the inactive state until transistor P30 is turned on.

After the potential of node ND10 rises to the sufficient level through to the capacitive coupling, the potential of signal line 160 rises and signal generating circuit 110 is activated. Thus, the latch circuit formed of inverter circuits 111 and 112 operates. At the time of operation of this latch circuit, the potential of node ND10 is higher than the potential of node ND15. In this state, the potential of node ND10 is at the relatively high level, so that node ND15 is discharged through transistor N3, and meanwhile, node ND10 is charged through transistor P12, signal line 160 and transistor P30. At certain levels of the potentials of nodes ND10 and ND15, the latch state of the latch circuit formed of inverter circuits 111 and 112 is fixed, and the potential levels of nodes ND10 and ND15 are fixed at the high level and the low level, respectively.

Since the drive circuit 40 also receives the supply voltage through signal line 160, drive circuit 40 is activated at the substantially same timing as the activation of inverters 111 and 112, and supplies the signal at the high level in accordance with the latched potential of node ND15. Power-on detection signal /POR, which is supplied from inverter circuit 5 in response to the output signal at the high level supplied from drive circuit 40, attains the ground potential level, i.e., low level. Then, node ND10 is discharged to the ground potential level through transistor N6 by reset block 130 formed of delay circuit 8 and reset circuit 6 after the elapsing of the predetermined time.

In response to the fall of node ND10 to the ground potential level, node ND15 is charged through transistors P1 and P30, and thus the potential level thereof slowly rises. When the potential levels of node ND10 and node ND15 cross each other, the latch state of the latch circuit formed of inverter circuits 111 and 112 is inverted, so that node ND10 is stabilized at the low level and node ND15 is stabilized at the high level.

As the potential level of node ND15 attains the high level, the output of drive circuit 40 attains the low level, so that power-on detection signal /POR is raised through inverter circuit 5 from the ground potential level, i.e., low level to supply voltage VCC level, i.e., high level.

In response to the rise of power-on detection signal /POR to the high level, the potential of node ND4 is discharged through transistor N12 to attain the ground potential level, and transistor N6 included in reset circuit 6 is turned off.

At the power-off, signal generating circuit 110 and drive circuit 40 are deactivated in response to the power-off. Node ND10 falls to a negative potential through the capacitive coupling of capacitance 1. Also, all the positive charges accumulated in node ND15 remain, without being discharged (the positive charges of node ND15 will be discharged through transistor P1 and signal line 160). The negative charges in node ND10 and the positive charges in node ND15 are gradually discharged through a parasitic capacitance, and both attain the ground potential.

In this operation, if the power is applied immediately after the power-off, the potential of node ND10 starts to rise from a negative potential level. However, the latch circuit formed of inverter circuits 111 and 112 is activated when supply voltage VCC becomes a value not less than the absolute value of threshold voltage Vthp of transistor P30. At this time, the potential of node ND10 has risen above the potential level of node ND15. Due to the rise of the potential of node ND10, transistor N3 is turned on, and the positive charges of capacitance 7 is discharged. The residual positive charge in node ND15 provides a potential level which allows n-channel MOS transistor N14 to be set at a high resistance on-state. Therefore, the discharging path for the positive charges in node ND10 does not exist, so that the positive charges, which have been supplied from capacitance 1 through to the capacitive coupling, remain in node ND10 without a loss, and thus the charge supply effect by the coupling-capacitance of capacitance 1 is sufficiently exerted.

When inverter circuits 111 and 112 are activated, the potential level of node ND10 becomes higher than the potential level of node ND15, so that the discharging of transistor N3 is carried out more strongly than the discharging of transistor N14, and the charging of transistor P12 is carried out more strongly than the charging of transistor P1. Thereby, the relatively high level of node ND10 and the relatively low level of node ND15 are latched by inverter circuits 111 and 112, so that node ND10 is fixed at the high level and node ND15 is fixed at the low level. Thereby, power-on detection signal /POR is temporarily fixed at the ground potential level, i.e., low level, and then rises to the high level in response to the reset operation of reset circuit 6.

As described hereinabove, by delaying the activation timing of signal generating circuit 110 with respect to the power-on by the predetermined time, the capacitive coupling function of capacitance 1 can be sufficiently exerted, and thus the stable power-on detecting circuit can be implemented.

Drive circuit 40 receives the operation supply voltage through signal line 160. The purpose of this arrangement is to prevent the turn-on of both transistors P20 and N20, depending on the potential level attained by the positive charges accumulated in node ND15, and thus to prevent the flow of the current from the power supply potential to the ground potential at the power-on. The purpose is also to prevent the rising of power-on detection signal /POR to the high level due to the positive charges accumulated in node ND15 immediately after the power-on.

If power-on detection signal /POR would rise to the high level immediately after the power-on, a circuit carrying out an initializing operation would not be in the stable state at this time. Therefore, the initializing operation would be carried out with the instable supply voltage, or the initializing circuit would not detect the rise of power-on detection signal /POR and would not carry out the initializing operation. Therefore, the power-on detection signal /POR is raised from the low level to the high level after supply voltage VCC is stabilized, and the initializing operation is carried out when the circuit components included in the initializing circuit are stabilized.

In the activation control circuit shown in FIG. 9, one diode-coupled p-channel MOS transistor is used to activate signal generating circuit 110 and drive circuit 40 when supply voltage VCC rises to the value not less than the absolute value of the threshold value of the transistor. In this case, activation control circuit 150 may be formed of a plurality of diode-coupled p-channel MOS transistors which are connected in series.

As described above, activation control circuit 150 determines the operation timing of signal generating circuit 110 to be not earlier than the time at which the potential difference between the input node (node ND10) and output node (node ND15) of signal generating circuit 110 reaches or exceeds a value corresponding to the power-on state. Owing to this determination, the power-on detecting circuit which can accurately operate without malfunction can be obtained.

The p-channel MOS transistor which receives the supply voltage as the back gate bias is used as a component of activation control circuit 150, whereby the stable power-on detecting circuit which does not receive the influence by the substrate bias potential can be obtained.

The adjusting circuit 120 and activation control circuit 150 in the power detecting circuit shown in FIGS. 1 and 8 may be used in combination.

According to the first aspect of the invention, the driving capability of the latch circuit, which forms the signal generating circuit generating the signal indicative of the power-on in response to the output of power-on sensing circuit, is adjusted at the power-on and power-off. Therefore, no residual charges generate in the input and output nodes of the signal generating circuit, and the power-on detecting circuit can reliably detect the power-on.

Further, according to the first aspect of the invention, since the residual charges do not generate in the input node of the signal generating circuit, the output of the sensing circuit can be rapidly and surely transmitted to the signal generating circuit, and the power-on detecting circuit can stably detect the power-on.

According to the second aspect of the invention, since the activating timing of the signal generating circuit, which generates the signal indicative of the power-on in response to the power-on sensing output, is delayed the power-on, the signal generating circuit functions after the sensing output reaches the sufficient level, and thus the power-on can be surely detected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A device for detecting an application of a power supply voltage, comprising:
    voltage sensing means coupled to a power supply line for sensing an application of and an interruption of the power supply voltage on the power supply line;
    power supply status signal generating means coupled to and responsive to said voltage sensing means for generating a signal indicative of application of the power supply voltage, said power supply status signal generating means including a latch circuit having an input coupled to an output of said voltage sensing means, and an output coupled to said input; said latch circuit comprising:
        a first inverter circuit having an input coupled to the output of said voltage sensing means for inverting and amplifying a signal at the output of said voltage sensing means to generate said power supply status signal, and
        a second inverter circuit having an input coupled to the output of said first inverter circuit for inverting and amplifying an output signal of said first inverter circuit, and an output coupled to the output of said voltage sensing means; and
    control means coupled to said voltage sensing means and said power supply status signal generating means for adjusting a driving capability of said latch circuit upon the application and interruption of the power supply voltage, said control means comprising:
        adjusting means, coupled to at least one of said first and second inverter circuits of said latch circuit in said power supply status signal generating means for adjusting current driving ability of at least one of said first and second inverter circuits according to the interruption and application of the power supply voltage.

2. A device according to claim 1, wherein said adjusting means adjusts the driving capability of said first inverter circuit such that accumulation of positive charges from said power supply line at the output of said voltage sensing means is enhanced upon application of the power supply voltage and accumulation of negative charges from said voltage supply line at the output of said voltage sensing means is diminished upon the interruption of the power supply voltage.

3. A device according to claim 1, wherein
    said adjusting means adjusts a current supply capability of said second inverter circuit such that accumulation of positive charges at the output of said voltage sensing means is enhanced upon application of the power supply voltage and accumulation of negative charges at the output of said voltage sensing means is avoided upon interruption of said power supply voltage.

4. A device according to claim 1, wherein said adjusting means further comprises:
    means coupled to said voltage sensing meas and responsive to the power supply voltage for diminishing the discharge rate of the output of said voltage sensing means by said latch circuit upon application of the power supply voltage and for increasing the discharge rate of the output of said voltage sensing means by said latch circuit upon interruption of the power supply voltage.

5. A device according to claim 1,
    wherein said adjusting means comprises:
    adjusting element means for delaying the discharge through said second inverter circuit in response to the power supply voltage.

6. A device according to claim 5, wherein said second inverter circuit comprises:
    a first transistor responsive to the output of said first inverter circuit for charging said output of said voltage sensing means, and
    a second transistor responsive to the output of said first inverter circuit for discharging the output of said voltage sensing means, and
    wherein said adjusting element means comprises:
        a third transistor interposed between the output of said voltage sensing means and said second transistor, and
        a control element having a resistance for controlling turn-on and turn-off of said third transistor in response to the power supply voltage.

7. A device according to claim 6, wherein said third transistor comprises an n-channel field effect transistor having a control gate, and said control element comprises a resistance element having a resistance for transferring the power supply voltage to the control gate of the n-channel field effect transistor.

8. A device according to claim 1, further comprising control means, coupled to said power supply line and responsive to the power supply voltage for retarding an activation of the signal generating means.

9. A device according to claim 8, wherein said control means comprises:
    resistance means coupled to said power supply line for transferring the power supply voltage as an operating supply voltage to said power supply status signal generating means through a resistance.

10. The circuit according to claim 1, wherein said adjusting means includes means for adjusting a resistance of a charging path of said first inverter upon power interruption such that said resistance of said first inverter is lowered.

11. The circuit according to claim 1, wherein said adjusting means includes means for adjusting a resistance of a discharging path of said second inverter upon the application of the power supply voltage such that the resistance of said second inverter is increased with a predetermined time constant up to a predetermined maximum value.

12. A device for detecting an application of a power supply voltage, comprising:
voltage sensing means coupled to a power supply line for sensing an application of and an interruption of the power supply voltage on the power supply line;
power supply status signal generating means coupled to and responsive to said voltage sensing means for generating a signal indicative of application of the power supply voltage, said power supply status signal generating means including a latch circuit having an input coupled to an output of said voltage sensing means, and an output coupled to said input; said latch circuit comprising:
a first inverter circuit having an input coupled to the output of said voltage sensing means for inverting and amplifying a signal at the output of said voltage sensing means to generate said power supply status signal, and
a second inverter circuit having an input coupled to the output of said first inverter circuit for inverting and amplifying an output signal of said first inverter circuit, and an output coupled to the output of said voltage sensing means; and
control means coupled to said power supply status signal generating means for adjusting a driving capability of said latch circuit upon the application and interruption of the power supply voltage, said control means comprising:
adjusting means for adjusting current driving ability of at least one of said first and second inverter circuits according to the interruption and application of the power supply voltage,
wherein said second inverter circuit comprises:
a first transistor responsive to said first inverter circuit for charging the output of said voltage sensing means to said power supply voltage level, and
a second transistor responsive to the output of said first inverter circuit for discharging the output of said voltage sensing means to a predetermined reference voltage, and
wherein said adjusting means comprises:
variable resistance current path means connected between said second transistor and the output of said voltage sensing means for providing a variable resistance current flow path therebetween, and
a control element coupled to said variable resistance current path means and said power supply line and responsive to the power supply voltage on said power supply line for controlling resistance of said variable resistance current path means such that the variable resistance current path means cuts off the current flow between the second transistor and the output of said voltage sensing means upon the application of the power supply voltage while the variable resistance current path means provides a large current flow upon the interruption of the power supply voltage.

13. A device for detecting an application of a power supply voltage, comprising:
voltage sensing means coupled to a power supply line for sensing an application of and an interruption of the power supply voltage on the power supply line;
power supply status signal generating means coupled to and responsive to said voltage sensing means for generating a signal indicative of application of the power supply voltage, said power supply status signal generating means including a latch circuit having an input coupled to an output of said voltage sensing means, and an output coupled to said input; said latch circuit comprising:
a first inverter circuit having an input coupled to the output of said voltage sensing means for inverting a signal at the output of said voltage sensing means to generate said power supply status signal, and
a second inverter circuit having an input coupled to the output of said first inverter circuit for inverting an output signal of said first inverter circuit, and an output coupled to the output of said voltage sensing means; and
control means coupled to at least said power supply status signal generating means for adjusting a driving capability of said latch circuit upon the application and interruption of the power supply voltage, wherein said control means comprises:
adjusting means for controlling a driving capability of said latch circuit such that rate of charging of the output of the latch circuit is increased upon application of the power supply voltage and accumulation of positive charges from said power supply at the output of the latch circuit is suppressed upon interruption of the power supply voltage.

14. A device according to claim 13, wherein said adjusting means comprises:
means for slowing the charging of the output of the first inverter circuit.

15. A device for detecting an application of a power supply voltage, comprising:
voltage sensing means coupled to a power supply line for sensing an application of and an interruption of the power supply voltage on the power supply line;
power supply status signal generating means coupled to and responsive to said voltage sensing means for generating a signal indicative of application of the power supply voltage, said power supply status signal generating means including a latch circuit having an input coupled to an output of said voltage sensing means, and an output coupled to said input; said latch circuit comprising:
a first inverter circuit having an input coupled to the output of said voltage sensing means for inverting and amplifying a signal at the output of said voltage sensing means to generate said power supply status signal, and
a second inverter circuit having an input coupled to the output of said first inverter circuit for inverting and amplifying an output signal of said first inverter circuit, and an output coupled to the output of said voltage sensing means;
control means coupled to said voltage sensing means and said power supply status signal generating means for adjusting a driving capability of said latch circuit upon the application and interruption of the power supply voltage, said control means comprising:

adjusting means for controlling a driving capability of said latch circuit such that rate of charging of the output of the latch circuit is increased upon application of the power supply voltage and accumulation of positive charges from said power supply at the output of the latch circuit is suppressed upon interruption of the power supply voltage, and wherein said first inverter circuit comprises:

a first transistor responsive to the output of said voltage sensing means for charging the output of said voltage sensing means, and a second transistor responsive to the output of said voltage sensing means for discharging the output of the first inverter circuit, and wherein said adjusting means comprises:

current flow means for providing a current flow from said first transistor to the output of the first inverter circuit, and a control element for enlarging a resistance of said current flow means upon application of the power supply voltage and for lessening the resistance of the current flow means upon interruption of the power supply voltage.

16. A device according to claim 15, wherein said current flow means comprises a third transistor for supplying current, and said control includes means for retarding turn-on and turn-off of the third transistor.

17. A device according to claim 15, wherein said current flow means comprises a third transistor connected between said first transistor and the output of the latch circuit and having a control gate, and said control element comprises resistance means coupled to said control gate of said third transistor and having a resistance for normally turning on said third transistor.

18. A device according to claim 17, wherein said third transistor comprises a P channel field effect transistor, and said resistance means includes a resistor having a resistance for transferring a ground potential to the control gate.

19. A device for detecting an application of a power supply voltage, comprising:

voltage sensing means coupled to a power supply line for sensing an application of and an interruption of the power supply voltage on the power supply line;

power supply status signal generating means coupled to and responsive to said voltage sensing means for generating a signal indicative of application of the power supply voltage, said power supply status signal generating means including a latch circuit having an input coupled to an output of said voltage sensing means, and an output coupled to said input; said latch circuit comprising:

a first inverter circuit having an input coupled to the output of said voltage sensing means for inverting and amplifying a signal at the output of said voltage sensing means to generate said power supply status signal, and a second inverter circuit having an input coupled to the output of said first inverter circuit for inverting and amplifying an output signal of said first inverter circuit, and an output coupled to the output of said voltage sensing means; and control means coupled to said power supply status signal generating means for adjusting a driving capability of said latch circuit upon the application and interruption of the power supply voltage, wherein said latch circuit includes a first transistor responsive to said output of said voltage sensing means for charging the output of the latch circuit, and a second transistor responsive to said output of said voltage sensing means for discharging the output of the latch circuit, said first and second transistors constituting an inverter circuit, and wherein said control means includes a third transistor interposed between said first transistor and the output of the latch circuit and having a control gate, and resistance means coupled to said control gate of said third transistor and having a resistance for normally turning on said third transistor, wherein said third transistor comprises a P channel field effect transistor, and said resistance means includes a resistor having a resistance for transferring a ground potential to the control gate, and wherein said resistor comprises:

a first resistor-connected transistor connected between said control gate and the ground potential, and a second resistor-connected transistor connected between said control gate and the ground potential.

* * * * *